United States Patent [19]

Gelabert

[11] Patent Number: 4,636,660
[45] Date of Patent: Jan. 13, 1987

[54] FAIL-SAFE "AND" GATE USING CAPACITOR DISCHARGE THROUGH A TRANSFORMER

[75] Inventor: Andrés Gelabert, Margency, France

[73] Assignee: Jeumont-Schneider Corporation, Puteaux, France

[21] Appl. No.: 664,344

[22] Filed: Oct. 24, 1984

[30] Foreign Application Priority Data

Oct. 26, 1983 [FR] France ................... 83 17041

[51] Int. Cl.⁴ ........................................ H03K 19/007
[52] U.S. Cl. ................... 307/442; 307/200 A; 307/246; 307/318; 307/443; 307/446
[58] Field of Search ............ 307/200 A, 440, 442, 307/443, 446, 454, 246, 570, 270, 318

[56] References Cited

U.S. PATENT DOCUMENTS

| | | | |
|---|---|---|---|
| 3,254,232 | 5/1966 | Candy | 307/443 |
| 3,600,604 | 8/1971 | Thorne-Booth | 307/442 |
| 3,684,926 | 8/1972 | Kosko | 307/440 |
| 3,909,632 | 9/1975 | Sibley | 307/442 |
| 4,065,683 | 12/1977 | Clarke | 307/200 A X |
| 4,125,784 | 11/1978 | Harrison | 307/442 |

FOREIGN PATENT DOCUMENTS 2147481 9/1973 France .

Primary Examiner—Stanley D. Miller
Assistant Examiner—D. R. Hudspeth
Attorney, Agent, or Firm—Rines and Rines, Shapiro and Shapiro

[57] ABSTRACT

The invention involves an "AND" logic circuit with built-in safety comprising a first and a second input to which pulses can be applied, and respectively tied to the base of a first and a second transistor (1,2) each having a collector to which a reference voltage (5) is applied by means of a corresponding resistance (6,7), and comprising, in addition, a third transistor (3) having its base tied to ground by means of the secondary winding (15) of a transformer whose transforming ratio is less than unity, its collector tied to the positive terminal of the d.c. voltage supply by means of a resistance (13), and its emitter having the reference voltage (5) applied thereto. According to the invention, the first transistor (1) has its emitter tied by means of a first diode (8) and its collector tied by means of a capacitor (9) to ground, whereas the second transistor (2) has its emitter directly tied and its collector tied by means of a branch comprising a capacitor (10) and a second diode (11) in series to ground. The anode of the first diode (8) and the cathode of the second diode (11) are tied to ground.

3 Claims, 1 Drawing Figure

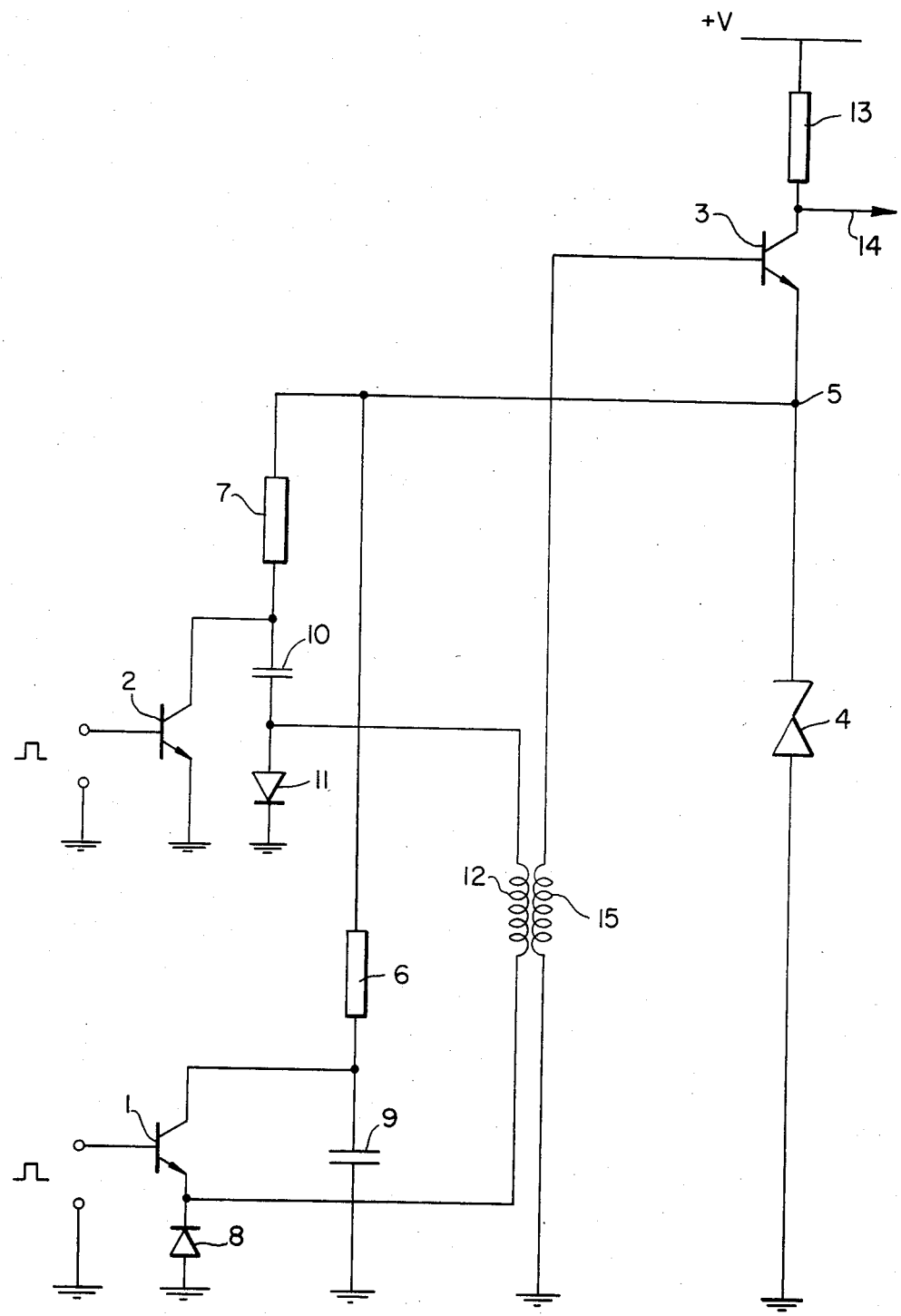

FAIL-SAFE "AND" GATE USING CAPACITOR DISCHARGE THROUGH A TRANSFORMER

This invention covers "AND"-type logic circuits with built-in safety (in the railroad meaning of this term), namely, that no operational anomaly, whatever it might be, can result in the transmission of information less restrictive than that authorized by the conditions present at the input of the circuit.

Such gates are generally placed in railroad command or control circuits, particularly for signaling and for automatic train operation.

For example, French Pat. No. FR-A 2 147 481 describes such an "AND" logic circuit. According to this patent the "AND" logic circuit comprises:

two inputs subjected respectively to a positive pulse and each connected to the base of an associated NPN transistor whose emitter is connected to ground and whose collector is connected to the first primary terminal of an associated single-phase transformer, the second primary terminal of each of the two above-mentioned transformers being connected to the emitter of a third NPN transistor and to the intermediate terminal of a resistance dividing bridge connected between ground and the positive pole of a d.c. current supply. The secondaries of the two transformers are connected in series between ground and the base of the third transistor, whose collector is connected to the positive pole of the supply by means of a resistance.

A fourth PNP transistor has its base is connected by means of a resistance to the collector of the third transistor, its emitter connected to the positive pole of the supply and its collector connected to ground by means of a resistance whose terminals constitute the output of the logic circuit, the ground being connected to the negative pole of the supply. In spite of its good operation, such a circuit has the particular disadvantage of using two transformers which have well known problems due to their cost and their size.

An object of this invention is to provide a similar logic circuit but requiring only one transformer.

In summary, the "AND" logic circuit with built-in safety according to the invention, comprises a first and a second input to which pulses can be applied and connected respectively to the base of a first and a second transistor each having a collector to which a reference voltage is applied by means of a resistance. In addition, it comprises a third transistor whose base is connected to the first terminal of a d.c. voltage supply by means of the secondary winding of a transformer having a transforming ratio is less than unity, and whose collector is connected to the second terminal of the said d.c. voltage supply by means of a resistance, the emitter of this transistor having an applied reference voltage.

The first transistor has its emitter tied to the first terminal of the d.c. voltage supply by means of a first diode and its collector tied thereto by means of a capacitor whereas the second transistor has its emitter directly tied to the first terminal of the d.c. voltage supply and its collector tied thereto by means of a branch comprising a capacitor and a second diode in series. The junction point of the capacitor and the second diode is tied to the junction point of the emitter of the first transistor and the first diode by means of the primary winding of the transformer. According to a preferred method of application, the first terminal which constitutes the negative pole of the supply voltage is connected to ground, and the transistors are type NPN. The anode of the first diode and the cathode of the second diode are tied to ground.

The invention will be better understood and other purposes, advantages and characteristics thereof will appear more clearly by reading the following description of a method of application given as a non-restrictive example, with reference to the accompanying drawing.

The drawing shows an electrical diagram of an "AND" logic circuit conforming to the present invention. Referring now to this drawing, the "AND" logic circuit comprises three type NPN transistors, respectively 1, 2, 3.

The bases of the first two transistors 1,2 constitute the two inputs of the circuit to which positive pulses are applied. A Zener diode 4 determines at the point 5 a reference voltage included between ground and the positive d.c. voltage +V provided by a voltage supply. The two input transistors 1, 2 are polarized by means of this reference voltage, that is, their respective collector is tied to the point 5 by means of a resistance 6, 7. As can be seen in the FIGURE, the emitter of the first transistor 1 is tied to ground by means of a diode 8 whose anode is tied to ground, whereas the emitter of the second transistor 2 is tied to ground.

In addition, the collector of the first transistor 1 is tied to ground by means of a capacitor 9, whereas the collector of the second transistor 2 is tied to ground by means of a branch comprising in series a capacitor 10 and a diode 11 whose cathode is tied to ground.

The collector of the second transistor 2 is tied to the emitter of the first transistor 1 by means of the capacitor 10 and the primary winding 12 of a transformer whose transforming ratio is less than unity, for example, 1:0.6.

The third transistor 3 has its emitter tied to point 5 and its collector, which constitutes the output 14 of the logic circuit, tied to the positive terminal of the voltage supply by means of a polarization resistance 13. Its base is tied to ground by means of the secondary winding 15 of the transformer. The functioning of this "AND" logic circuit is as follows, assuming that at the initial instant the two capacitors 9 and 10 are charged. When a positive pulse is applied on the base of the transistor 2, this transistor 2 becomes saturated and the positive terminal of the charged capacitor 10 is grounded. This capacitor 10 then discharges into the circuit comprising the primary winding 12 of the transformer and the diode 8. If a positive pulse is applied on the base of the transistor 1, this transistor is saturated and becomes conductive. The capacitor 9 then discharges into the circuit comprising the collector-emitter junction of this transistor 1, the primary winding 12 of the transformer and the diode 11. Since the transforming ratio of the transformer has been judiciously selected in such a manner that the discharge current from either capacitor 9 or 10 cannot induce in its secondary winding 15 a voltage permitting saturation of the third transistor 3, the latter remains blocked and a positive voltage is maintained on the output 14 of the circuit. This ratio is also selected in such a manner that the sum of the two discharge currents induces in the secondary winding 15 a voltage sufficient to saturate the third transistor 3.

Hence, when the two capacitors 9, 10 discharge at the same time, following the simultaneous or quasi-simultaneous application of a positive pulse on the base of the two transistors 1, 2, the transistor 3 becomes conductive and the reference voltage determined by the Zener diode 4 at the point 5 appears on the output 14 of the circuit.

The skilled person will favorably connect the output 14 to another transistor so as to obtain the desired signal at the output of the device.

Moreover, it is easy to see that this logic circuit has built-in safety (i.e., is fail-safe) inasmuch as the failure of any one of its elements does not result in the modification of the signal provided at the output 14 of the circuit, and this is true regardless of the type of failure of the transistors 1, 2, the diodes 8, 11, the condensers 9, 10 or the windings 12, 15 of the transformer. Obviously, any modification provided by the skilled person in the same context would not depart from the framework of the present invention.

I claim:

1. A fail-safe "AND" logic circuit, comprising a first transistor and a second transistor, the respective bases of which constitute two inputs of said circuit to which pulses can be applied and the respective collectors of which each being connected to a point of reference voltage through a resistance, and a third transistor having its base connected to a first terminal of a d.c. voltage supply through a secondary winding of a transformer having a transforming ratio less than unity, its collector connected to a second terminal of said d.c. voltage supply through a resistance, and its emitter connected to said point of reference voltage, said first transistor having its emitter connected through a first diode to said first terminal of said d.c. supply and its collector connected through a first capacitor to that terminal, said second transistor having its emitter connected to said first terminal of said d.c. supply and its collector connected to that terminal through a series circuit including a second capacitor and a second diode in series, a junction of said second capacitor and said second diode being connected to a junction of the emitter of said first transistor and said first diode through a primary winding of said transformer.

2. A logic circuit according to claim 1, wherein said first terminal constitutes the negative pole of said supply and is connected to ground, wherein said transistors are type NPN, and wherein the anode of said first diode and the cathode of said second diode are connected to ground.

3. A logic circuit according to claim 1, wherein said point of reference voltage is connected to said first terminal through a Zener diode which establishes said reference voltage.

* * * * *